United States Patent
Zeng et al.

(10) Patent No.: US 10,854,768 B2
(45) Date of Patent: Dec. 1, 2020

(54) OPTOELECTRONIC COMPONENT WITH CURRENT DEFLECTED TO HIGH-GAIN PATHS COMPRISING AN AVALANCHE PHOTODIODE HAVING AN ABSORBING REGION ON A P-DOPED LATERAL BOUNDARY, AN N-DOPED LATERAL BOUNDARY AND AN AMPLIFYING REGION

(71) Applicant: HEWLETT PACKARD ENTERPRISE DEVELOPMENT LP, Houston, TX (US)

(72) Inventors: Xiaoge Zeng, Palo Alto, CA (US); Zhihong Huang, Palo Alto, CA (US); Di Liang, Santa Barbara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 67 days.

(21) Appl. No.: 16/226,753

(22) Filed: Dec. 20, 2018

(65) Prior Publication Data
US 2020/0203548 A1 Jun. 25, 2020

(51) Int. Cl.
*H01L 31/107* (2006.01)
*G01J 1/44* (2006.01)
*H01L 31/18* (2006.01)

(52) U.S. Cl.
CPC .......... *H01L 31/1075* (2013.01); *G01J 1/44* (2013.01); *H01L 31/1804* (2013.01); *G01J 2001/4466* (2013.01)

(58) Field of Classification Search
CPC .............. H01H 59/0009; H01L 25/167; H01L 25/0753; H01L 33/62; H01L 31/107; H01L 27/14669; H01L 31/028; H01L 31/0304; H01L 27/14643; H01L 31/1075; H01L 31/0312; H03K 17/943; H04B 10/25891
USPC ........................................... 250/214.1, 214 R
See application file for complete search history.

(56) References Cited

U.S. PATENT DOCUMENTS

| | | | |
|---|---|---|---|
| 3,821,777 A * | 6/1974 | Lawrence | H01L 31/107 257/186 |
| 8,461,624 B2 | 6/2013 | Na et al. | |
| 9,391,225 B1 | 7/2016 | Davids et al. | |
| 9,490,385 B2 | 11/2016 | Huang et al. | |
| 9,570,647 B2 | 2/2017 | Yuan et al. | |

(Continued)

OTHER PUBLICATIONS

Gity, F. et al.; "Modelling Ge/Si Avalanche Photodiodes"; Jan. 20, 2010; 2 pages.

*Primary Examiner* — Que Tan Le
(74) *Attorney, Agent, or Firm* — Nolte Intellectual Property Law Group

(57) ABSTRACT

A three-terminal avalanche photodiode provides a first controllable voltage drop across a light absorbing region and a second, independently controllable, voltage drop across a photocurrent amplifying region. The absorbing region may also have a different composition from the amplifying region, allowing further independent optimization of the two functional regions. An insulating layer blocks leakage paths, redirecting photocurrent toward the region(s) of highest avalanche gain. The resulting high-gain, low-bias avalanche photodiodes may be fabricated in integrated optical circuits using commercial CMOS processes, operated by power supplies common to mature computer architecture, and used for optical interconnects, light sensing, and other applications.

12 Claims, 5 Drawing Sheets

(56) References Cited

U.S. PATENT DOCUMENTS 9,614,119 B2    4/2017    Kang et al.
9,755,096 B2    9/2017    Novack et al.

* cited by examiner

OPTOELECTRONIC COMPONENT WITH CURRENT DEFLECTED TO HIGH-GAIN PATHS COMPRISING AN AVALANCHE PHOTODIODE HAVING AN ABSORBING REGION ON A P-DOPED LATERAL BOUNDARY, AN N-DOPED LATERAL BOUNDARY AND AN AMPLIFYING REGION

STATEMENT OF GOVERNMENT RIGHTS

This invention was made with Government support under Agreement Number H98230-18-3-0001. The Government has certain rights in the invention.

BACKGROUND

In the field of optoelectronics, integrated optical circuits or subassemblies may be designed to replace their conventional electronic counterparts in computing, signal-processing, and other devices. The cost of fabricating large-scale optical circuits, particularly silicon photonics, has significantly decreased in recent years. Nevertheless, all-optical devices may not yet be practical for some applications. In some devices, high-speed and/or broadband optical components may be strategically combined with low-power or low-cost electronic components. Photodetectors, which convert optical signals to electronic signals, play a crucial role at the interface between optical and electronic components.

Optical signal levels in integrated optical circuits may be very low. First, the light sources are often low-power, both to conserve energy and to avoid dissipating enough waste heat to degrade overall device performance. Second, some of the source light may be lost in the waveguides and other optics in the circuit. Therefore, photodetectors in these integrated optical circuits preferably function well at low light levels.

An avalanche photodiode (APD) is a type of photodetector in which a charge carrier produced by photon absorption enters a gain region where it frees other charge carriers by collision. These other charge carriers also collide in the gain region, each of them freeing multiple additional charge carriers. For each charge carrier that enters the gain region, many more exit to be received by downstream electronics. Thus a low-light optical input produces an amplified electrical output.

The amplification mechanism of an APD may be compared or analogous to the operation of the photomultiplier tubes commonly used for low-level light detection in classical optics. However, unlike photomultiplier tubes, APDs can be fabricated on the miniaturized scale of integrated optical chips, using materials and processes already characterized and used in semiconductor fabrication.

BRIEF DESCRIPTION OF DRAWINGS

The present disclosure may be better understood from the following detailed description when read with the accompanying Figures. It is emphasized that, in accordance with standard practice in the industry, various features are not drawn to scale. In fact, the dimensions or locations of functional attributes may be relocated or combined based on design, security, performance, or other factors known in the art of computer systems. Further, the order of processing may be altered for some functions, both internally and with respect to each other. That is, some functions may not require serial processing and therefore may be performed in an order different than shown or possibly in parallel with each other. For a detailed description of various examples, reference will now be made to the accompanying drawings, in which.

DETAILED DESCRIPTION

Figure 1A:
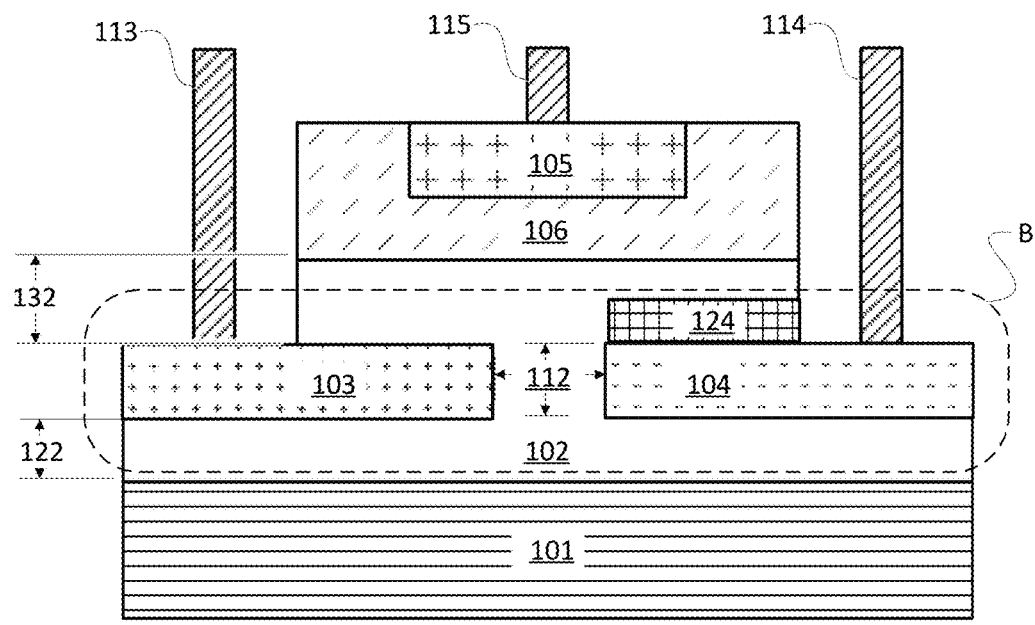
FIG. 1A illustrates a simplified avalanche photodiode according to one or more disclosed examples.

The description of the different advantageous examples has been presented for purposes of illustration and is not intended to be exhaustive or limited to the examples in the form disclosed. Many modifications and variations will be apparent to those of ordinary skill in the art. Further, different advantageous examples may provide different advantages as compared to other advantageous examples. The example or examples selected are chosen and described in order to best explain the principles of the examples, the practical application, and to enable others of ordinary skill in the art to understand the disclosure for various examples with various modifications as are suited to the use contemplated.

Before the present disclosure is described in detail, it is to be understood that, unless otherwise indicated, this disclosure is not limited to specific procedures or articles, whether described or not. It is further to be understood that the terminology used herein is for the purpose of describing particular examples only and is not intended to limit the scope of the present disclosure.

Replacing conventional integrated circuits with integrated optics may dramatically improve the speed at which a device can collect and distribute information. However, many optoelectronic components require more power to run than the electronics they replace. The challenge of providing sufficient operating power arises, for example, when integrating optoelectronic subsystems into existing electronic devices. A conventional avalanche photodiode (APD) may require biasing at 25V—more than twice the 12V limit of typical CMOS computer architecture. Conventional APDs' power consumption is also high due to the high bias voltage required to achieve breakdown.

For purposes of this document, a "semiconductor" is any solid substance with conductivity higher than that of an insulator but lower than that of most metals. The conductivity of a semiconductor increases with temperature and may also be increased by adding impurities ("doping"). A "substrate" is a workpiece such as a wafer, chip, optical window, or other supporting structure on which components such as the disclosed APDs are fabricated. The substrate may include previously fabricated layers and/or structures underneath the level of the APD. A "layer" is a stratum deposited, grown, created by doping, or otherwise formed on a substrate or over a substrate. The term "layer" may include laminates and other stacks as well as single-material strata. An "absorber" or "absorbing material" may be any material that absorbs light and produces a photocurrent.

"Charge carriers" shall mean those attracted to negative charges; i.e., holes in a forward-biased device and electrons in a reverse-biased device. Examples of reverse-biased devices do not preclude the possibility of forward-biased variations. "Amplifying" refers to increasing the amplitude of a photocurrent, such as when charge carriers released by absorption of photons are multiplied by collision in an amplifying region. A "terminal" may refer either to an electrode or to a conductive lead connected to the electrode.

The terms "over," "above," "under," "underneath," and "below" may include "in contact with" or "separated from by intervening layers." "Lateral" shall mean "in a direction parallel to the substrate surface."

An APD may be considered to act upon incoming light in two ways: (1) absorbing the light, causing an initial photocurrent to flow, and (2) amplifying the photocurrent to a level usable by downstream electronics, sometimes referred to as "photomultiplication." In some simple APDs, absorption and amplification occur in a single region of semiconductor material such as silicon (Si) or germanium (Ge). However, at the 1300-1500 nm near-infrared operating wavelengths of silicon photonics, Ge may be more effective for absorbing photons and emitting charge carriers, and Si may be more effective for multiplying the charge carriers. Separating the absorbing and amplifying functions into different regions (optionally with different compositions) allows the functions to be optimized independently rather than traded off against each other.

Some existing APDs, such as separate absorption charge multiplication (SACM) APDs, reduce the breakdown voltage by inserting a specially designed layer of charged material between the absorbing region and the amplifying region. The charged layer concentrates the electric field in the amplifying region, causing most of the applied bias voltage to drop across the amplifying region. However, the charged layer is optically lossy, and its complex doping profile requires very precise control.

Another approach to reducing bias voltage in APDs has been to add a third electrical terminal. Three-terminal APDs provide a first voltage drop between the absorbing region and the amplifying region (e.g., across the absorbing region) and an independently controllable second voltage drop across the amplifying region. One of the voltage drops may be used to control the electric field (E-field) in the absorbing region while using the other to independently control the E-field in the amplifying region. This approach may result in increased photon absorption, which in turn increases the initially generated photocurrent. However, a significant fraction of this photocurrent may travel directly from the absorbing region to a collecting region of the APD (e.g., an n-doped region under the absorbing region). Photocurrent that bypasses the amplifying region is not multiplied, and therefore makes only weak contributions to the output signal.

In the disclosed examples, the generation of charge carriers takes place in a first region of the APD (e.g., an absorbing region), and their multiplication takes place in a separate second region (e.g., an amplification region). This allows the materials in each region to be independently optimized for their particular functions. Moreover, the disclosed examples use three electrical terminals to provide two independently controllable voltage drops. One of the voltage drops determines the current flow through the absorbing region while the other determines the current flow through the amplifying region. In addition, an electrically insulating layer is provided between the absorbing region and the leakage paths that circumvent the amplifying region, redirecting more photon-generated charge carriers into the amplifying region to be multiplied, thus increasing the gain of the APD relative to an APD without such an electrically insulating layer.

A first surface region of the amplifying material may be p-doped to form a contact for a first terminal. A second surface region of the amplifying material may be n-doped to form a contact for a second terminal. A surface region of the absorbing material may be p-doped to form a contact for a third terminal. The p-doped and n-doped regions of the amplifying material may be extended underneath the absorbing material to form opposing lateral boundaries of an undoped interstice of amplifying material. The undoped interstice between the p-doped lateral boundary and the n-doped lateral boundary is the amplifying region where the gain is highest. An insulating layer between the absorbing region and the n-doped lateral boundary (e.g., disposed or formed over the n-doped lateral boundary) prevents charge carriers (negative charge carriers in a reverse-biased device, positive charge carriers in a forward-biased device) from leaking through the lowest-resistance, non-amplifying n-doped lateral boundary. Charge carriers blocked by the insulating layer are redirected through the path of next-lowest impedance, e.g., across or through at least a portion of the nearest undoped interstice where they are multiplied.

Optionally, multiple amplifying interstices may be formed by alternating multiple p-doped and n-doped lateral boundaries between the first terminal and the second terminal. The insulating layer may then be formed over all the n-doped lateral boundaries (or formed as a blanket layer and selectively etched away from the p-doped lateral boundaries, undoped interstices, and second terminal contact area).

The resulting APDs with enhanced gain and low bias voltage may be used in integrated optical assemblies, combined optical/electronic circuits and optical connections between electronic modules. They confer particular advantages in small or crowded spaces, low-light conditions, thermally sensitive environments, or where limited operating power or bias voltage is available. APDs with enhanced sensitivity, able to operate at the standard bias voltage of existing computer architecture, may dramatically improve the performance of integrated optics in communication (for example, in datacom and telecom applications) and information collection (for example, in sensors for Internet of Things, LiDAR, quantum computing, bio/medical applications, etc.).

FIG. 1A illustrates a simplified avalanche photodiode according to one or more disclosed examples. Three electric terminals—first terminal 113, second terminal 114, and third terminal 115—control local electric field distribution inside the APD by providing two different voltage drops that can be set independently. In a reverse-biased device, first terminal 113 has a lower voltage than second terminal 114; in a forward-biased device, the opposite would be true.

Third terminal 115 contacts a p-doped region 105 of absorbing region 106. Absorbing region 106 may be any material or layer of material that absorbs photons at the APD's operating wavelengths and emits a photocurrent of charge carriers as part of the absorption mechanism. In the near-infrared range of 1300-1550 nm, Ge is a strong absorber and a well-understood semiconductor fabrication material. Indium gallium arsenide (InGaAs) is an alternative near-infrared absorber up to 1600 nm wavelength. Si is effective at wavelengths less than 1100 nm.

To multiply the charge carriers and amplify the photocurrent, amplifying region 112 is formed in a layer of semiconductor 102 by the E-field between a p-doped lateral boundary 103 and an n-doped lateral boundary 104. Semiconductor 102 may be any material that readily multiplies incident charge carriers in the presence of an E-field. If absorbing region 106 is very efficient and converts virtually all of the incident light into photocurrent, there is no need for semiconductor 102 to also strongly absorb the operating wavelength. Therefore, Si, which has very low multiplication noise and is also among the best-known and lowest-cost semiconductor fabrication materials, may be used as semiconductor 102. InGaAs may introduce more multiplication noise than Si, and Ge may be noisier still.

P-doped and n-doped lateral boundaries 103 and 104 are formed in a layer of semiconductor 102 (e.g., by p- or n-doping respective regions or portions of the semiconductor 102). The lateral boundaries 103 and 104 are three-dimensional doped structures in the silicon with an undoped interstice between them. Each of the p-doped and n-doped lateral boundaries 103 and 104 may include opposing sidewalls extending between upper and lower surfaces, respectively. As illustrated, in some implementations, the lateral boundaries 103 and 104 may include exposed portions (e.g., outward-facing ends extending past respective lateral sides of the absorber 106) and covered portions (e.g., inward-facing ends extending medially under the absorbing region 106).

The outward-facing end of p-doped lateral boundary 103 contacts first terminal 113, while the outward-facing end of n-doped lateral boundary 104 contacts second terminal 114. When a voltage drop is applied between first terminal 113 and second terminal 114, the resulting voltage difference between the right side wall of p-doped lateral boundary 103 and the left side wall of n-doped lateral boundary 104 create an E-field in the undoped interstice between them. The E-field causes charge carriers passing through the undoped interstice to multiply by collision. Thus, when such a voltage is applied, the undoped interstice becomes an amplifying region 112 (e.g., formed between inner sidewalls of the p- and n-doped lateral boundaries).

In a reverse-biased implementation, p-doped lateral boundary 103 repels negative charge carriers and pushes them toward amplifying region 112, while n-doped lateral boundary 104 attracts negative charge carriers and tends to pull them away from amplifying region 112. However, insulating layer 124 over n-doped lateral boundary 104 (e.g., over covered portions of n-doped lateral boundary 104) blocks the leakage path from the absorbing region 106 through the top of n-doped lateral boundary 104. With the insulator in place, the charge carriers attracted to n-doped lateral boundary 104 may be re-directed to cross part of amplifying region 112 in order to reach n-doped lateral boundary 104 from the side (e.g., as described in more detail below with respect to FIG. 2B). Insulating layer 124 may include silicon oxide, other oxides, nitrides, polymers, or doped regions (e.g., hydrogen-doped or reverse-doped). In some implementations, insulating layer 124 may be 8-12 nm thick.

In some implementations, an undoped layer 122 of semiconductor 102 may extend beneath p-doped lateral boundary 103, n-doped lateral boundary 104, and amplifying region 112. Additionally or alternatively, an undoped layer 132 of semiconductor 102 may extend above p-doped lateral boundary 103, insulating layer 124, and amplifying region 112.

The APD structure may be fabricated on substrate 101. Substrate 101 may have any number and type of layers and structures underneath semiconductor 102. In some implementations, substrate 101 may be a silicon-on-insulator (SOI) substrate with a layer of native Si, and the native Si may be used as part of semiconductor 102. Its surface may be doped to form p-doped lateral boundary 103 and n-doped lateral boundary 104. An undoped layer 122 may be preserved underneath p-doped lateral boundary 103, n-doped lateral boundary 104, and amplifying region 112. After insulating layer 124 is formed, another undoped layer 132 of semiconductor 102 may optionally be formed, and absorbing region 106 may be formed over that. In some implementations, semiconductor 102, absorbing region 106, or both may be single-crystal materials. Such layers may be formed by epitaxy or any other suitable method.

Figure 1B:
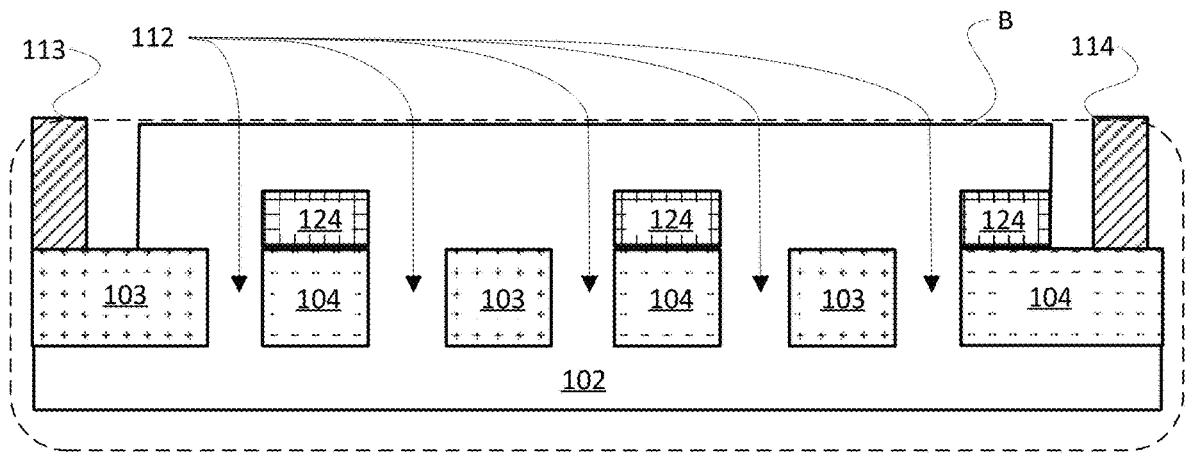
FIG. 1B illustrates a more complex avalanche photodiode according to one or more disclosed examples.

FIG. 1B illustrates a more complex avalanche photodiode according to one or more disclosed examples. The part of the APD shown in this figure is an interior zone analogous to the outlined area "B" on the APD of FIG. 1A.

The multiplication gain of an APD depends on the E-field in the amplifying region. This E-field is controlled by the voltage drop across two of the three electric terminals. The shorter the distance between the p-doped and n-doped lateral boundaries—i.e., the narrower the undoped interstice that forms the amplifying region—the lower the breakdown voltage required to operate the APD. Low breakdown voltage reduces the power consumed by the APD and, in some implementations, allows the APD to operate at an existing standard voltage when embedded in a legacy device, such as the 12V common to CMOS-based architecture.

A narrow (e.g., 100-500 nm) amplifying region 112 is preferable for reducing breakdown voltage, but it may be more difficult to redirect many of the charge carriers into a region of this size because absorbing region 106 (see FIG. 1A) is relatively wide. One solution is to have multiple narrow amplifying regions 112 between first terminal 113 and second terminal 114, as in FIG. 1B. Here, five narrow amplifying regions 112 are bounded by multiple discrete p-doped lateral boundaries 103 and n-doped lateral boundaries 104, with all the n-doped lateral boundaries 104 covered by insulating layer 124 to prevent leakage. As illustrated, insulating layer 124 extends entirely over some of the n-doped lateral boundaries and only partially over other n-doped lateral boundaries; insulating layer 124 may, for example, be etched or otherwise removed from a contact area for attaching second terminal 114. Alternatively, insulating layer 124 may extend entirely over all the n-doped lateral boundaries. In such a case, a via may be formed through insulating layer 124 to allow connection of second terminal 114 to n-doped lateral boundary 104.

Figure 2A:
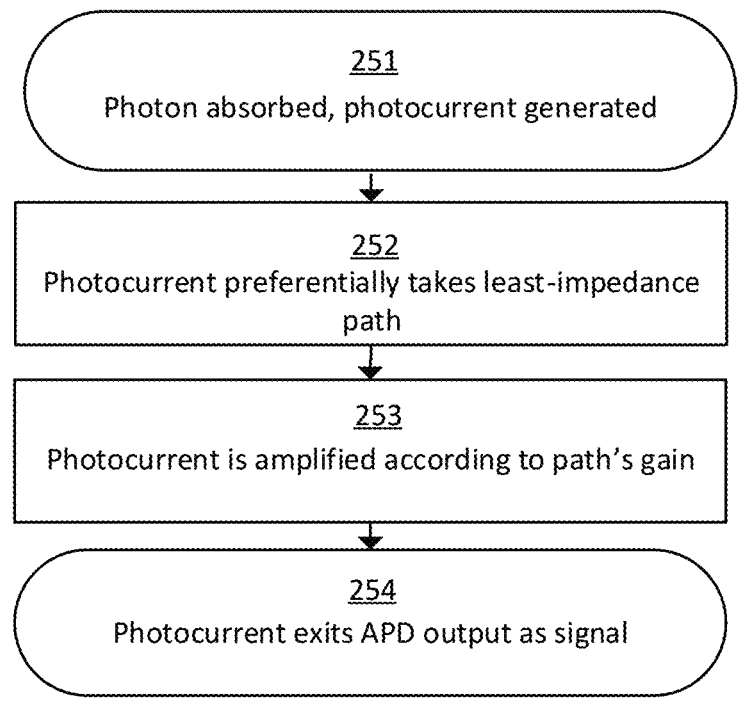
FIG. 2A illustrates the process of conversion of light to photoelectricity and the amplification of the electricity according to one or more disclosed examples.

FIG. 2A illustrates the process of conversion of light to photoelectricity and the amplification of the electricity according to one or more disclosed examples. In operation 251, incident photons are absorbed (e.g., in the absorbing region) by a material that releases charge carriers in response, creating a photocurrent. In operation 252, the photocurrent flows through the APD down the lowest-impedance path(s) available. In operation 253, the photocurrent is amplified (e.g., in the amplifying region) depending on the gain of the path it takes. Photocurrent flowing through amplifying regions is amplified, but photocurrent flowing in other paths may not be multiplied. Finally, in operation 254 the photocurrent exits as signal being delivered by the APD.

Figure 2B:
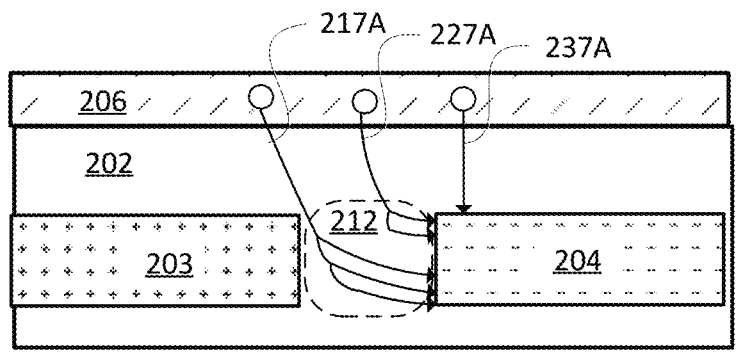
FIG. 2B illustrates photocurrent leakage through unshielded n-doped lateral boundaries.

FIG. 2B illustrates photocurrent leakage through unshielded n-doped lateral boundaries. For simplicity, only one amplifying region 212, one p-doped lateral boundary 203, and one n-doped lateral boundary 204 are shown.

Photocurrents 217A, 227A, and 237A originate in absorbing region 206 and travel into semiconductor 202. Photocurrent 217A is generated over p-doped lateral boundary 203 but is repelled by the p-doped material to flow toward and into the lower-impedance amplifying region 212. Photocurrent 227A is generated over amplifying region 212, is pulled toward the even-lower-impedance path through n-doped lateral boundary 204, but still crosses part of amplifying region 212. However, photocurrent 237A is generated over n-doped lateral boundary 204. Because all the other paths are higher-impedance, photocurrent 237A flows straight into n-doped lateral boundary 204 without traversing any of amplifying region 212. Depending on the construction of the rest of the APD, while photocurrent 237A may still be collected, it is not multiplied and will not contribute much to the output signal.

Figure 2C:
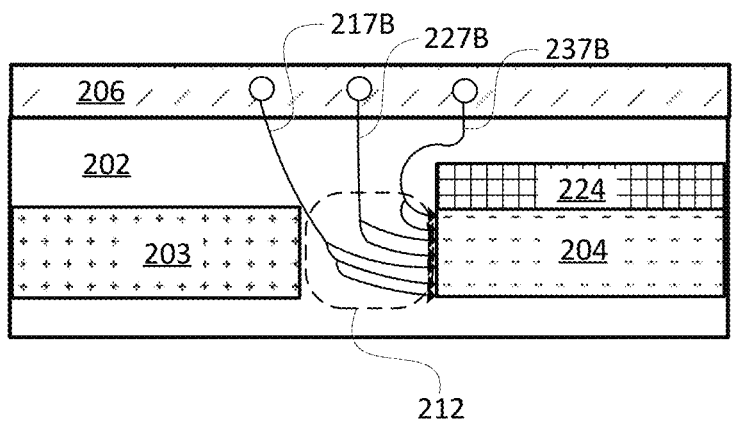
FIG. 2C illustrates charge carrier redirection through amplifying regions by shielding n-doped lateral boundaries according to one or more disclosed examples.

FIG. 2C illustrates charge carrier redirection through amplifying regions by shielding n-doped lateral boundaries according to one or more disclosed examples. With the low-impedance leakage path directly from absorbing region 206 to n-doped lateral boundary 204 blocked by insulating layer 224, the lowest-impedance path for photocurrent 237B is re-directed through amplifying region 212, where it is amplified (e.g., in contrast to photocurrent 237A which was not amplified). Photocurrent 227B emerges above amplifying region 212 but is not immediately pulled toward n-doped lateral boundary 204 because n-doped lateral boundary 204 is shielded by insulating layer 224. Therefore, photocurrent 227B takes a longer path through amplifying region 212 than photocurrent 227A of FIG. 2A. Photocurrent 217B, which emerges over p-doped lateral boundary 203 relatively far from n-doped lateral boundary 204, takes essentially the same path as photocurrent 217A in FIG. 2B.

Therefore, insulating layer 224 blocks non-amplifying leakage paths and redirects photocurrent from the blocked paths through the amplifying region (e.g., photocurrent 237B), leaves existing amplifying paths undisturbed (e.g., photocurrent 217B), and/or increases the path of other existing amplifying paths through the amplifying region (e.g., photocurrent 227B). This results in an increase in gain of the APD relative to an APD without the insulating layer 224.

Figure 3A:
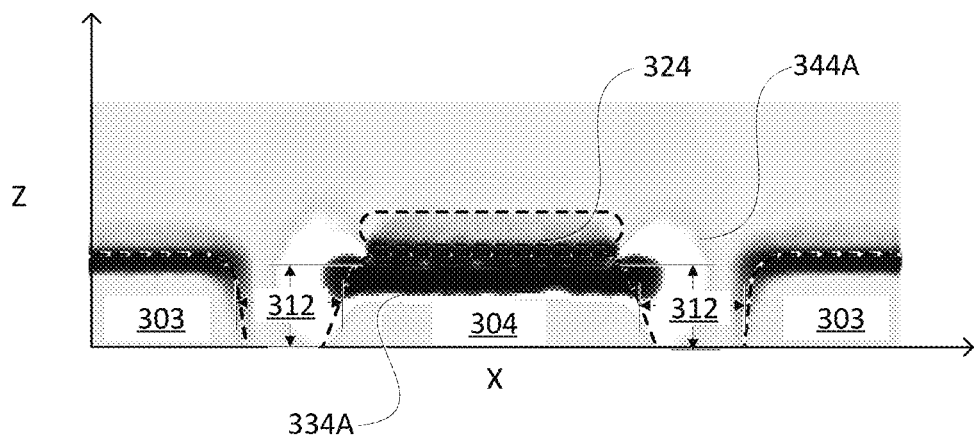
FIG. 3A illustrates simulation results for a z-oriented electric field in an avalanche photodiode according to one or more disclosed examples.

FIG. 3A illustrates simulation results for a z-oriented electric field in an avalanche photodiode according to one or more disclosed examples. Insulating layer 324 (formed by reverse doping in this simulation), n-doped lateral boundary 304, p-doped lateral boundaries 303, and amplifying regions 312 are overlaid for reference. Dark area 334A represents the strongest z-oriented E-field, and white halo 344 represents a weaker, but still significant, z-oriented E-field.

Figure 3B:
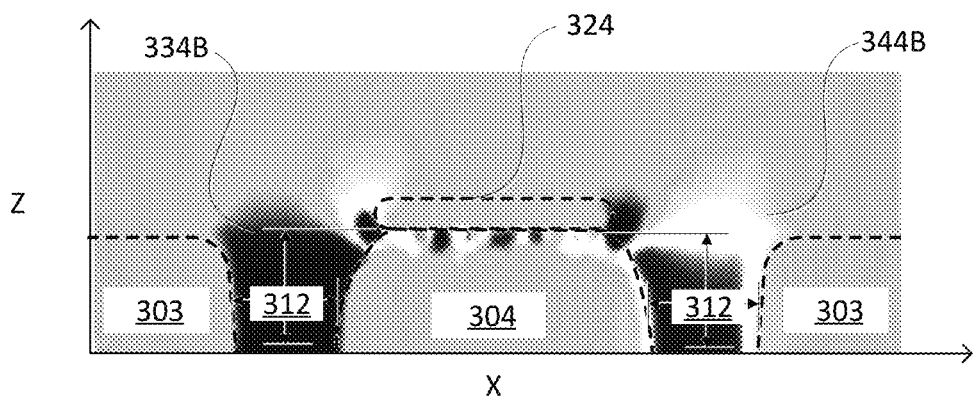
FIG. 3B illustrates simulation results for an x-oriented electric field in an avalanche photodiode according to one or more disclosed examples.

FIG. 3B illustrates simulation results for an x-oriented electric field in an avalanche photodiode according to one or more disclosed examples. Insulating layer 324 (formed by reverse doping in this simulation), n-doped lateral boundary 304, p-doped lateral boundaries 303, and amplifying regions 312 are overlaid for reference. Dark area 334B represents the strongest x-oriented E-field, and white halo 344B represents a weaker, but still significant, x-oriented E-field.

FIGS. 3A and 3B show that the E-field distribution depends strongly on the orientation of the field. The strongest z-oriented E-field 334A in FIG. 3A is mostly concentrated in n-doped lateral boundary 304 directly under insulating layer 324, while the strongest x-oriented E-field 334B in FIG. 3B is mostly concentrated in amplifying regions 312 beside n-doped lateral boundary 304.

Figure 3C:
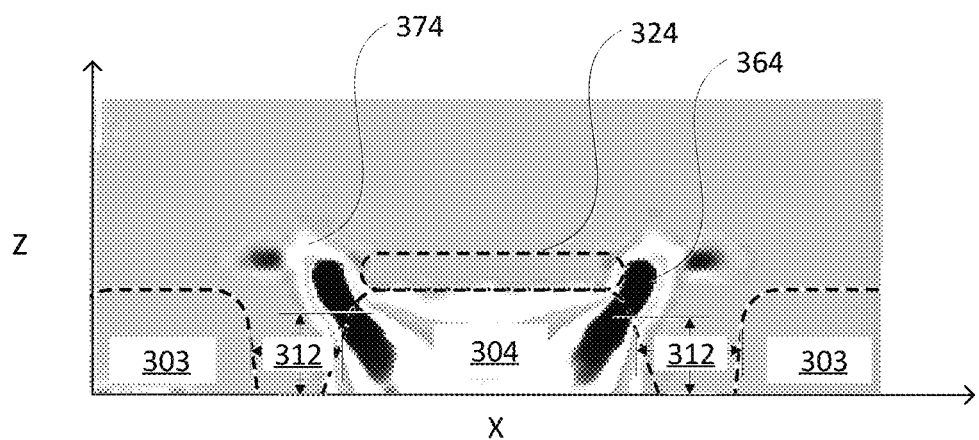
FIG. 3C illustrates simulation results for vertical photocurrent density in an avalanche photodiode according to one or more disclosed examples.

FIG. 3C illustrates simulation results for vertical photocurrent density in an avalanche photodiode according to one or more disclosed examples. Insulating layer 324 (formed by reverse doping in this simulation), n-doped lateral boundary 304, p-doped lateral boundaries 303, and amplifying regions 312 are overlaid for reference. Dark area 364 represents the strongest vertical photocurrent density, and white halo 374 represents a weaker, but still significant, vertical photocurrent density.

FIG. 3C shows very low leakage current through the top of lateral n-doped silicon region boundary 304, with most of the photocurrent crossing one of the amplifying regions 312 before being collected.

Figure 4:
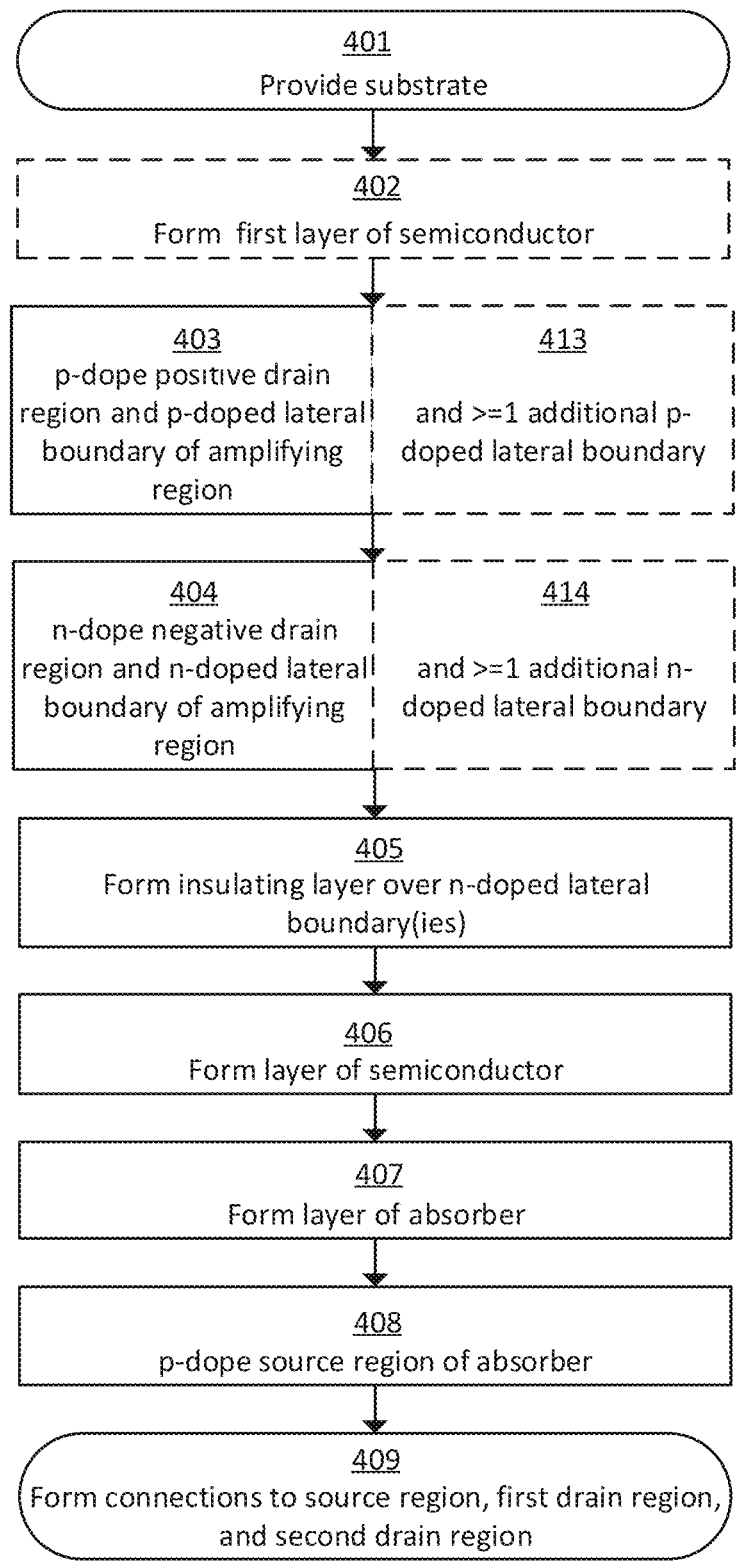
FIG. 4 illustrates a method of fabricating an avalanche photodiode according to one or more disclosed examples.

FIG. 4 illustrates a method of fabricating an avalanche photodiode according to one or more disclosed examples. In Operation 401, a substrate is provided. Operation 402, forming a first layer of semiconductor over the substrate, may be optional depending on the type of substrate used. For example, silicon-on-insulator (SOI) chips would obviate Operation 402 because SOI chips come with a top layer of native single-crystal silicon. The P and N contact regions could be implanted in the top silicon layer of the SOI chip.

Operation 403 involves p-doping a first terminal region and a p-doped lateral boundary of an amplifying region. In optional Operation 413, at least one additional p-doped lateral boundary may be formed. Operation 404 involves n-doping a second terminal region and an n-doped lateral boundary of the amplifying region. In optional Operation 414, at least one additional n-doped lateral boundary may be formed. In Operation 405, an insulating layer is formed over all n-doped lateral boundaries (and, if necessary, removed from regions that are not n-doped lateral boundaries). For example, a thin layer of silicon oxide may be selectively deposited on top of the n-doped lateral boundaries, or an insulating layer may be blanket-deposited over the amplifying regions and lateral boundaries, then selectively etched away from the amplifying regions and anywhere else it may be unwanted. The insulating layer may include silicon oxide, other oxides, nitrides, polymers, or doped regions (e.g., hydrogen-doped). In some implementations, the insulating layer may be 8-12 nm thick.

In Operation 406, a second layer of semiconductor is formed over the p-doped lateral boundaries and n-doped lateral boundaries. In Operation 407, a layer of absorbing material is formed over the top layer of semiconductor. In some implementations, for these two operations, a layer of epitaxial silicon and a layer of epitaxial germanium may be grown consecutively. In Operation 408, a top region of the layer of absorbing material is p-doped to use as a contact for the third terminal. Finally, in Operation 409, electrical connections are formed to the absorbing region, the p-doped lateral boundaries, and the n-doped lateral boundaries.

Figure 5A:
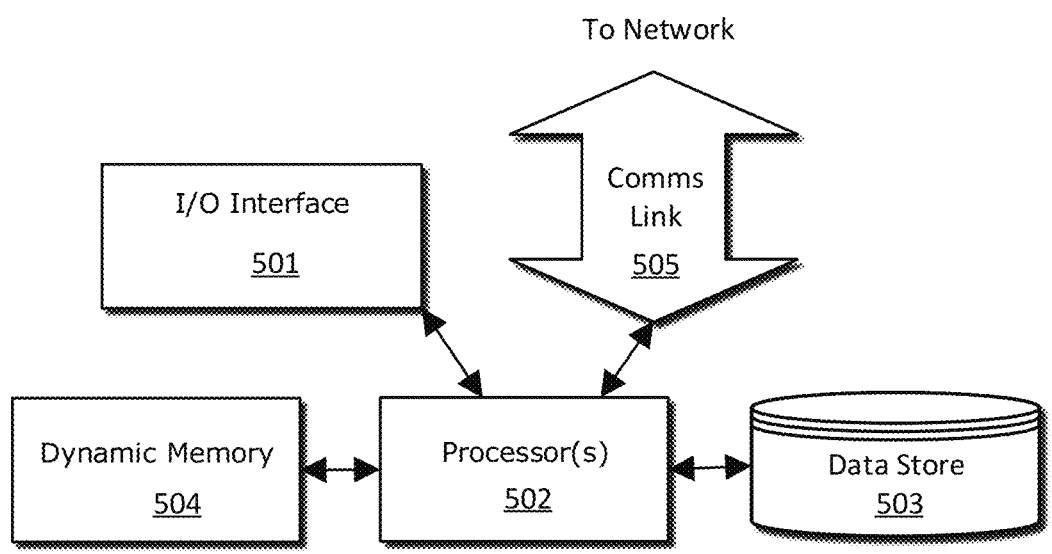
FIG. 5A illustrates a generalized computing or communication device into which an integrated optical circuit may be embedded according to one or more disclosed examples.

FIG. 5A illustrates a generalized computing or communication device into which an integrated optical circuit may be embedded according to one or more disclosed examples.

An absence of any of the illustrated components, however, does not remove a device from the scope of the description. Any or all of input/output (I/O) interface 501, processor 502, data store 503, dynamic memory 504, or communications link 505 may incorporate embedded integrated optical subsystems, connections, or sensors.

Figure 5B:
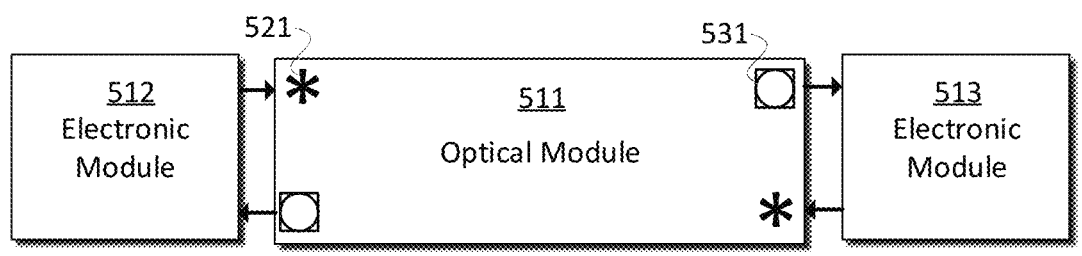
FIG. 5B illustrates an optical module interoperating with two electrical modules in a generalized computing or communication device according to one or more disclosed examples.

FIG. 5B illustrates an optical module interoperating with two electrical modules in a generalized computing or communication device according to one or more disclosed examples. Optical module 511 connects electrical modules 512 and 513. Each one of electronic modules 512, 513 controls the generation of light from a light source 521, such as a diode laser or light-emitting diode. For example, light source 521 could be modulated to encode messages. Each one of electronic modules 512, 513 monitors the output of a photodetector 531, such as one of the disclosed APDs. One of the simpler examples is where electronic modules 512, 513 are distributed components such as memory arrays or processor cores and optical module 511 is a fast communications link between them.

In some implementations, such as sensors, a single APD or APD array may be packaged by itself and coupled directly to an electronics module. For example, the APD may sense light directly, or optionally through a protective faceplate or filter, and the electronics analyze and output or use the signal level. The light may be ambient light or from a source outside the APD's device.

Not all features of an actual implementation are described in every example of this specification. It will be appreciated that in the development of any such actual example, numerous decisions may be made to achieve the developer's specific goals for a particular implementation, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Certain terms have been used throughout the description and claim to refer to system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to." Also, the term "couple" or "couples" is intended to mean either an indirect or direct wired or wireless connection. Thus, if a first device couples to a second device, that connection may be through a direct connection or an indirect connection via other devices and connections. The recitation "based on" is intended to mean "based at least in part on." Therefore, if X is based on Y, X may be a function of Y and any number of other factors.

The above discussion is meant to be illustrative of the principles and various implementations of the present disclosure. Numerous variations and modifications will become apparent to those skilled in the art once the above disclosure is fully appreciated. It is intended that the following claims be interpreted to embrace all such variations and modifications.

We claim:

1. An avalanche photodiode comprising:
   an amplifying region on a substrate;
   a p-doped lateral boundary on a first side of the amplifying region;
   a first terminal coupled to the p-doped lateral boundary;
   an n-doped lateral boundary on a second side of the amplifying region;
   a second terminal coupled to the n-doped lateral boundary;
   an absorbing region on the p-doped lateral boundary, the n-doped lateral boundary, and the amplifying region;
   a third terminal coupled to the absorbing region; and
   an insulating layer between the absorbing region and the n-doped lateral boundary.

2. The avalanche photodiode of claim 1, further comprising a p-doped contact region between the absorbing region and the third terminal.

3. The avalanche photodiode of claim 1, further comprising an undoped layer between the substrate and a shared bottom surface of the p-doped lateral boundary, the n-doped lateral boundary, and the amplifying region.

4. The avalanche photodiode of claim 1, further comprising an undoped layer between the absorbing region and a shared top surface of the p-doped lateral boundary, the n-doped lateral boundary, and the amplifying region.

5. The avalanche photodiode of claim 1, wherein the substrate comprises a silicon-on-insulator wafer.

6. The avalanche photodiode of claim 1, wherein the amplifying region between the p-doped lateral boundary and the n-doped lateral boundary is 100-500 nanometers wide.

7. The avalanche photodiode of claim 1, wherein the amplifying region comprises silicon, and the absorbing region comprises germanium.

8. The avalanche photodiode of claim 1, wherein the insulating layer comprises at least one of an oxide, a nitride, a polymer, or a doped region.

9. The avalanche photodiode of claim 1, wherein the insulating layer is 8-12 nm thick.

10. A method of fabricating an optoelectronic component, the method comprising:
    p-doping a semiconductor to form a first contact and a p-doped lateral boundary for an amplifying region;
    n-doping the semiconductor to form a second contact and an n-doped lateral boundary for an amplifying region;
    forming an insulating layer over the n-doped lateral boundary;
    forming an absorbing region over the p-doped lateral boundary, the n-doped lateral boundary, and the amplifying region;
    p-doping the absorbing region to form a third contact; and
    forming connections to the first contact, the second contact, and the third contact.

11. The method of claim 10, wherein the semiconductor comprises a native silicon layer of a silicon-on-insulator substrate.

12. The method of claim 10, wherein the p-doping of the semiconductor further comprises forming at least one additional p-doped lateral boundary, and the n-doping of the semiconductor further comprises forming at least one additional n-doped lateral boundary.

* * * * *